(12) United States Patent
Cho (10) Patent No.: US 12,131,791 B2
(45) Date of Patent: Oct. 29, 2024

(54) SEMICONDUCTOR SYSTEM INCLUDING SEMICONDUCTOR DEVICE FOR PERFORMING DEFECTIVE ANALYSIS

(71) Applicant: SK hynix Inc., Gyeonggi-do (KR)

(72) Inventor: Byung Goo Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 179 days.

(21) Appl. No.: 18/070,606

(22) Filed: Nov. 29, 2022

(65) Prior Publication Data
US 2024/0079077 A1 Mar. 7, 2024

(30) Foreign Application Priority Data
Sep. 2, 2022 (KR) .................. 10-2022-0111424

(51) Int. Cl.
*G11C 29/44* (2006.01)
*G11C 29/18* (2006.01)
*G11C 29/52* (2006.01)

(52) U.S. Cl.
CPC .......... *G11C 29/4401* (2013.01); *G11C 29/18* (2013.01); *G11C 29/52* (2013.01); *G11C 2029/1802* (2013.01)

(58) Field of Classification Search
CPC ..... G11C 29/4401; G11C 29/18; G11C 29/52; G11C 2029/1802
See application file for complete search history.

(56) References Cited

U.S. PATENT DOCUMENTS 6,654,918 B2    11/2003  Porterfield
9,653,181 B1 *   5/2017  Shim .................... G11C 29/804
9,680,478 B2     6/2017  Karalar et al.

\* cited by examiner

*Primary Examiner* — Son L Mai
(74) *Attorney, Agent, or Firm* — IP & T GROUP LLP (57) ABSTRACT

A semiconductor system includes a controller configured to: select a plurality of fail points based on defect analysis information collected in a process stage, and provide an address designating at least one of the fail points together with a partial reset command; and a semiconductor device including a plurality of functional regions each including one or more of the fail points, the semiconductor device configured to reset, in response to the partial reset command, a sequential circuit disposed in a target functional region corresponding to the address among the functional regions.

20 Claims, 10 Drawing Sheets

SEMICONDUCTOR SYSTEM INCLUDING SEMICONDUCTOR DEVICE FOR PERFORMING DEFECTIVE ANALYSIS

CROSS-REFERENCE TO RELATED APPLICATION

The present application claims the benefit of Korean Patent Application No. 10-2022-0111424, filed on Sep. 2, 2022, which is incorporated herein by reference in its entirety.

BACKGROUND

1. Field

Various embodiments of the present invention relate to a semiconductor design technology, and more particularly, to a semiconductor system including a semiconductor device for performing defective analysis.

2. Description of the Related Art

The process for fabricating a semiconductor device includes a plurality of unit processes, and defects may occur in each unit process. The defects may occur due to various factors such as defect density of wafers, layout patterns in design, and characteristics of processes, which may lead to a decrease in semiconductor fabricating yield.

In order to improve yield, it is necessary to detect or predict defective factors early. The physical defect analysis performed for defect analysis takes a long time to perform fault diagnosis of the semiconductor device and to check the chip where the defect occurred. In addition, physical defect analysis should be repeated inefficiently even though it is a similar defect.

SUMMARY

Embodiments of the present invention are directed to a semiconductor system capable of partially resetting fail points of a semiconductor device.

According to an embodiment of the present invention, a semiconductor system includes a controller configured to: select a plurality of fail points based on defect analysis information collected in a process stage, and provide an address designating at least one of the fail points together with a partial reset command; and a semiconductor device including a plurality of functional regions each including one or more of the fail points, the semiconductor device configured to reset, in response to the partial reset command, a sequential circuit disposed in a target functional region corresponding to the address among the functional regions.

According to an embodiment of the present invention, an operation method of a semiconductor system includes selecting, by a controller, a plurality of fail points based on defect analysis information collected in a process stage; providing, by the controller, an address designating at least one of the fail points together with a partial reset command; and resetting, in response to the partial reset command and by a semiconductor device including a plurality of functional regions, each including one or more of the fail points, a sequential circuit disposed in a target functional region corresponding to the address among the functional regions.

According to an embodiment of the present invention, a semiconductor device includes a command input circuit configured to generate a partial reset command by decoding an external command; a reset control circuit configured to decode a partial reset address in response to the partial reset command and configured to generate a plurality of partial reset signals among which a partial reset signal corresponding to the partial reset address is activated; and an internal circuit including a plurality of functional regions having respective sequential circuits, one or more of which have one or more fail points, the internal circuit being configured to reset the sequential circuit disposed in a target functional region corresponding to the activated partial reset signal among the functional regions.

According to an embodiment of the present invention, a semiconductor system includes a semiconductor device including operational circuit groups indicated by respective addresses; and a controller configured to provide the semiconductor device with a command together with a selected one of the addresses, wherein the semiconductor device is configured to reset, in response to the command, a group indicated by the selected address among the operational circuit groups.

According to the embodiments of the present invention, the semiconductor system may reduce a time required for defect analysis by partially resetting the fail points that are selected based on the defect analysis information collected in the process stage. In addition, the semiconductor system may secure accurate defect analysis information by adding the actual field defect analysis results that are obtained by partially resetting the fail points to the previously collected statistical-based defect analysis information.

DETAILED DESCRIPTION

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Figure 1:
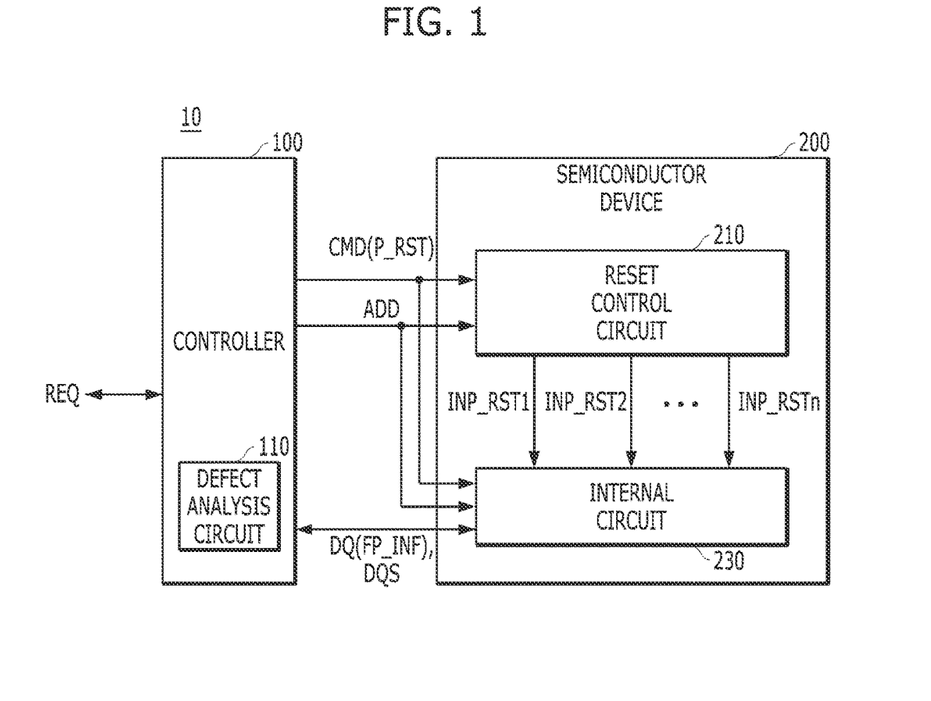
FIG. 1 is a block diagram illustrating a memory system in accordance with an embodiment of the present invention.

FIG. 1 is a block diagram illustrating a memory system 10 in accordance with an embodiment of the present invention.

Referring to FIG. 1, the memory system 10 may include a controller 100 and a semiconductor device 200.

The controller 100 may control an overall operation of the semiconductor device 200 by providing a command CMD and an address ADD to the semiconductor device 200 in response to a request REQ provided from a host. The controller 100 may transmit and receive data DQ together with a data strobe signal DQS to and from the semiconductor device 200. For example, the controller 100 may output write data DQ together with a write command CMD and an address ADD in synchronization with a data strobe signal DQS during a write (or program) operation. The controller 100 may output a read command RD and an address ADD to the semiconductor device 200 during a read operation, and may receive read data DQ in synchronization with a data strobe signal DQS from the semiconductor device 200 and provide the read data DQ to the host.

Moreover, the controller 100 may include a test device as a configuration capable of controlling the operation of the semiconductor device 200. The controller 100 may control the semiconductor device 200 to perform a test operation by sequentially instructing a write operation and a read operation.

In an embodiment of the present invention, the controller 100 may collect defect analysis information at a process stage. Preferably, the controller 100 may collect statistical-based defect analysis information at a process stage rather than defect information obtained in an actual field. That is, the controller 100 may collect a plurality of fail points of the semiconductor device 200, which are statistically likely to cause defects. The controller 100 may select the fail points of the semiconductor device 200 based on the collected defect analysis information and provide the semiconductor device 200 with an address ADD designating at least one of the fail points together with a command CMD (hereinafter, a partial reset command P_RST) indicating a partial reset operation. After providing the partial reset command P_RST to the semiconductor device 200, the controller 100 may additionally provide a command CMD (e.g., a write command and a read command), an address ADD, and/or data DQ for the semiconductor device 200 so as to perform a test operation, and receive a test result FP_INF in form of the data DQ from the semiconductor device 200.

In detail, the controller 100 may include a defect analysis circuit 110 for collecting the defect analysis information in the process stage and selecting the fail points based on the collected defect analysis information. The defect analysis circuit 110 may update the defect analysis information based on the test result FP_INF provided from the semiconductor device 200 after the partial reset operation performed according to the partial reset command P_RST.

The semiconductor device 200 may operate in response to the control of the controller 100. The semiconductor device 200 may perform a write (or program) operation, a read operation and the like, according to the command CMD, the address ADD, and/or the data DQ with the data strobe signal DQS provided from the controller 100. In an embodiment of the present invention, the semiconductor device 200 may be divided into a plurality of functional regions, each including one or more fail points of the fail points. That is, the controller 100 may provide the address ADD to the semiconductor device 200 together with the partial reset command P_RST to designate one of the functional regions. In this disclosure, a functional region may be a group including one or more operational circuits and a fail point may be one of the operational circuits, as discussed later with FIGS. 8A to 8C. Hereinafter, a functional region designated by the address ADD provided with the partial reset command P_RST will be defined as a "target functional region". The semiconductor device 200 may reset only the target functional region designated by the address ADD according to the partial reset command P_RST provided from the controller 100.

In detail, the semiconductor device 200 may include a reset control circuit 210 and an internal circuit 230.

The reset control circuit 210 may generate a plurality of partial reset signals INP_RST1 to INP_RSTn according to the partial reset command P_RST and the address ADD. The reset control circuit 210 may activate a partial reset signal designated by the address ADD among the partial reset signals INP_RST1 to INP_RSTn. Hereinafter, the partial reset signals INP_RST1 to INP_RSTn will be described as an example of a signal activated to a logic high level.

The internal circuit 230 may perform internal operations such as the write (or program) operation, the read operation, and the like, according to the command CMD, the address ADD, and/or the data DQ together with the data strobe signal DQS. The internal circuit 230 may output the data DQ together with the data strobe signal DQS to the controller 100 as a result of performing the internal operation.

Figure 2:
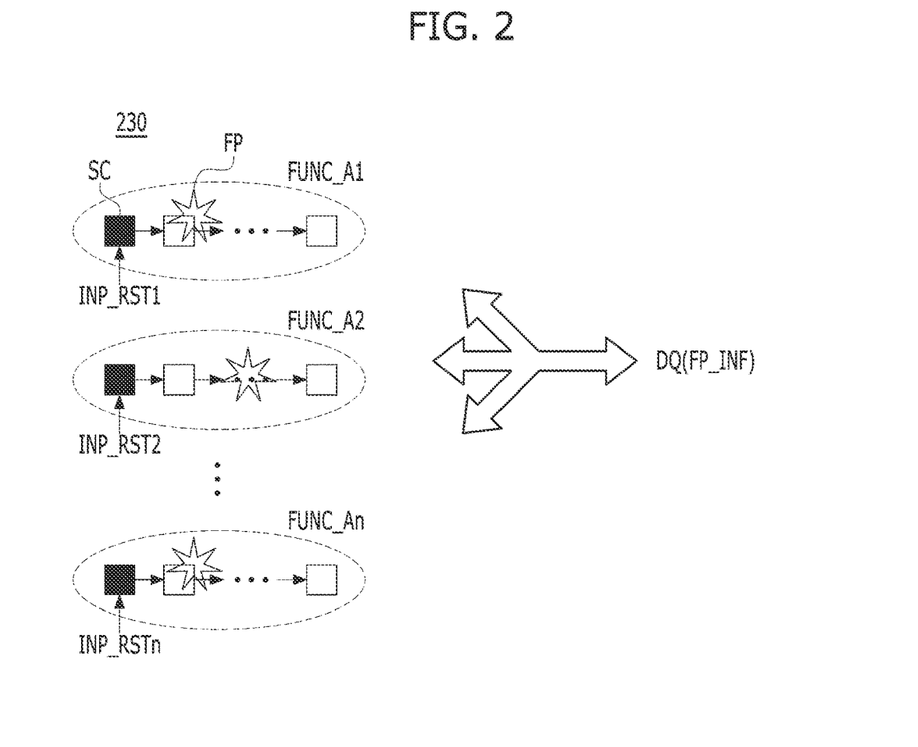
FIG. 2 is a configuration diagram conceptually illustrating an internal circuit of the semiconductor device of FIG. 1 in accordance with an embodiment of the present invention.

FIG. 2 is a configuration diagram conceptually illustrating an internal circuit of the semiconductor device of FIG. 1 in accordance with an embodiment of the present invention.

Referring to FIG. 2, the internal circuit 230 may be divided into a plurality of functional regions FUNC_A1 to FUNC_An including one or more fail points FP, respectively. The plurality of functional regions FUNC_A1 to FUNC_An may be classified according to a function of performing an operation for a predetermined purpose. The operation for a predetermined purpose may be performed in each of the plurality of functional regions FUNC_A1 to FUNC_An under the control of signals derived from at least one of the command CMD, the address ADD, and/or the data DQ.

For example, the functional regions FUNC_A1 to FUNC_An may include a repair circuit that performs a repair operation, an error correction circuit that performs an error correction operation, a termination circuit for impedance matching, an output driver for outputting the data, an input buffer for receiving the data/address/command, and so on. In addition, the functional regions FUNC_A1 to FUNC_An may include functional blocks for performing functions of smaller units. Each functional region may include one or more logical circuits coupled in series or in parallel, decoding circuits, multiplexers, amplifiers/comparators, and/or sequential circuits. For example, the logical circuits may be implemented with logic gates, the amplifiers/comparators may be implemented with operational amplifiers, and the sequential circuits may be implemented with latch circuits or flip-flops. In each functional region, the logical circuits, the decoding circuits, the multiplexers, the amplifiers/comparators, and/or the sequential circuits may be sequentially coupled in series or in parallel to perform assigned functions.

In an embodiment of the present invention, the partial reset signals INP_RST1 to INP_RSTn may be provided to the functional regions FUNC_A1 to FUNC_An, respectively. One or more sequential circuits arranged in each functional region may be implemented with flip-flops to receive a corresponding partial reset signal as a reset signal. Preferably, among the sequential circuits disposed in each functional region, a sequential circuit (SC of FIG. 2) disposed at a frontmost end may be reset according to a corresponding partial reset signal.

The internal circuit 230 may perform a test operation according to the command CMD, the address ADD, and/or the data DQ provided from the controller 100 after the partial reset operation, and output the test result FP_INF in form of the data DQ.

Hereinafter, referring to FIGS. 1 to 3, an operation of the memory system 10 will be described.

Figure 3:
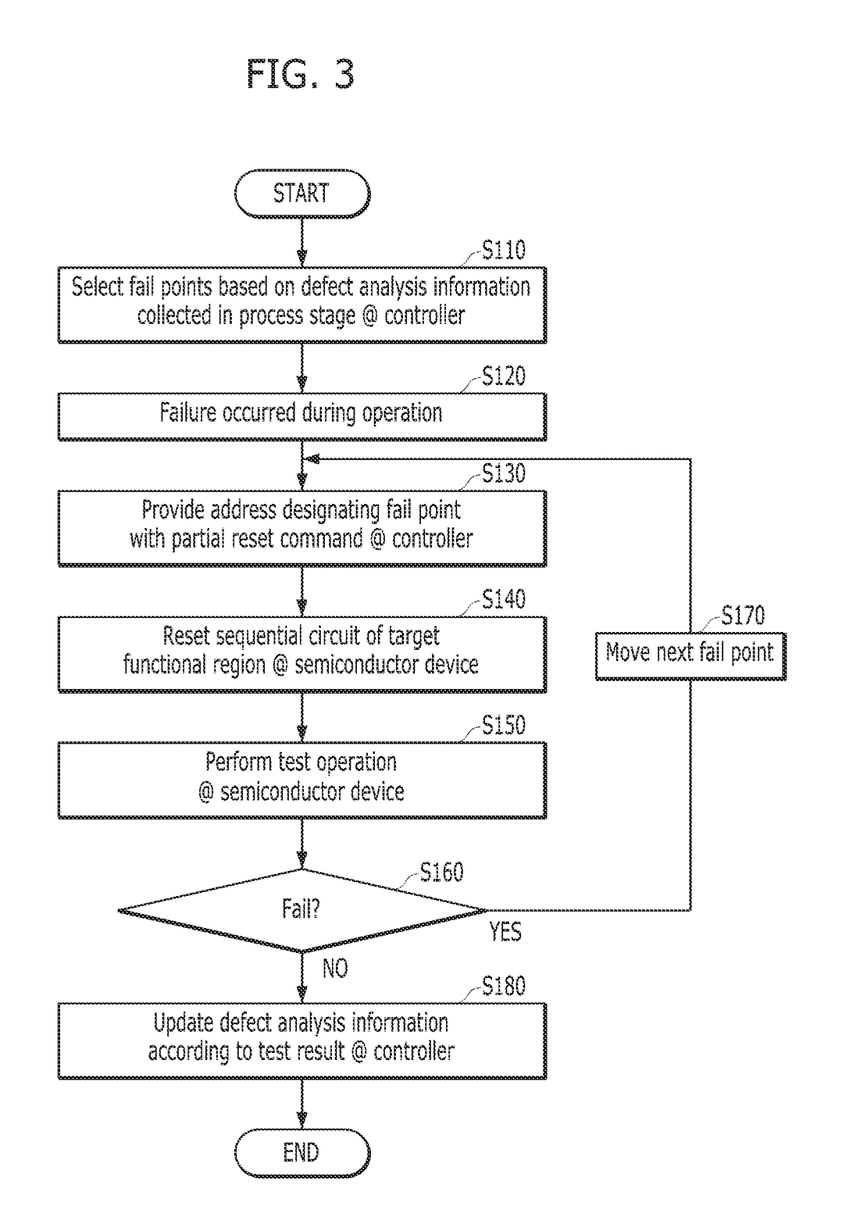
FIG. 3 is a flow chart for describing an operation of a memory system in accordance with an embodiment of the present invention.

FIG. 3 is a flow chart for describing an operation of the memory system 10 in accordance with an embodiment of the present invention.

Referring to FIG. 3, the defect analysis circuit 110 of the controller 100 may select the fail points FP of the semiconductor device 200 based on the defect analysis information collected in the process stage (at S110).

If a failure occurred during the operation of the semiconductor device 200 (at S120), the controller 100 may provide the address ADD designating one of the functional regions FUNC_A1 to FUNC_An of the semiconductor device 200 together with the partial reset command P_RST (at S130). In this case, a target functional region may be defined by the address ADD and may include one of the fail points FP.

The semiconductor device 200 may reset only the target functional region corresponding to the address ADD among the functional regions FUNC_A1 to FUNC_An, according to the partial reset command P_RST provided from the controller 100 (at S140). In detail, the reset control circuit 210 may activate only a partial reset signal corresponding to the target functional region among the partial reset signals INP_RST1 to INP_RSTn according to the partial reset command P_RST and the address ADD. Accordingly, one or more sequential circuits disposed in the target functional region may be reset. For example, the sequential circuit SC disposed at the frontmost end of the target functional region may be reset according to the activated partial reset signal. Accordingly, only the target functional region may be initialized.

Thereafter, the controller 100 additionally provides the command CMD (e.g., the write and read commands), the address ADDR, and/or the data DQ to the semiconductor device 200 so as to perform a test operation (at S150). The test operation at this time may be performed on all functional regions FUNC_A1 to FUNC_An of the internal circuit 230.

If the test result FP_INF is determined to be a fail (YES in S160), the controller 100 may determine that the target functional region is normal because the test operation performed after only initializing the target functional region is also a fail. The controller 100 may provide the semiconductor device 200 with an address ADD designating the next fail point together with the partial reset command P_RST (at S170). Accordingly, a new target functional region may be selected, and the operations (at S130 to S150) may be repeatedly performed.

On the other hand, if the test result FP_INF is determined to be successful (NO in S160), the controller 100 may determine that the target functional region is abnormal/defective and may provide the test result FP_INF indicating that the fail point of the target functional region is the actual fall point to the defect analysis circuit 110. Accordingly, the defect analysis circuit 110 may update the defect analysis information according to the test result FP_INF (at S180).

As described above, the semiconductor system 10 according to the embodiment of the present invention may reduce a time required for defect analysis by partially resetting the fail points that are selected based on the statistical-based defect analysis information collected in the process stage. In addition, the semiconductor system 10 may secure the accurate defect analysis information by adding the actual field defect analysis results that are obtained by partially resetting the fall points, to the previously collected statistical-based defect analysis information.

Hereinafter, a memory device will be described as an example of a semiconductor device as a specific embodiment. However, the present invention is not limited thereto and may be applied to various types of semiconductor devices.

Figure 4:
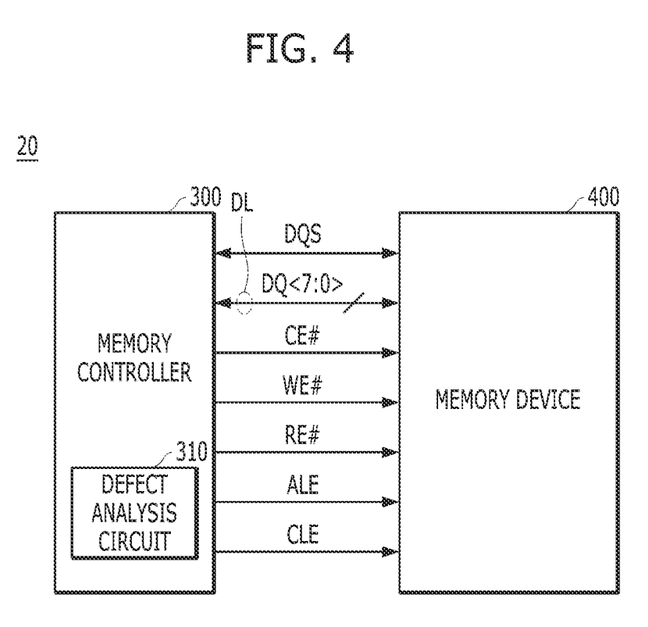
FIG. 4 is a block diagram illustrating a memory system in accordance with an embodiment of the present invention.

FIG. 4 is a block diagram illustrating a memory system 20 in accordance with an embodiment of the present invention.

Referring to FIG. 4, the memory system 20 may include a memory controller 300 and a memory device 400. In FIG. 4, signals exchanged between the memory controller 300 and the memory device 400 are shown. The memory device 400 may exchange a command CMD, an address ADD, or data DQ with the memory controller 300 in form of data DQ<7:0> transmitted to the same data lines DL. In addition, the memory device 400 may transmit and receive a data strobe signal DQS with the memory controller 300. Additionally, the memory device 400 may receive a chip enable signal CE #, an address latch enable signal ALE, a command latch enable signal CLE, a write enable signal WE #, a read enable signal RE #, and the like.

The chip enable signal CE # may be a signal indicating that the memory device 400 (i.e., a memory chip) is operable, and activated to a logic low level. The chip enable signal CE # may be selectively applied to memory chips coupled to the same channel. When the chip enable signal CE # is activated to a logic low level, it may denote that all operations within a corresponding memory chip are possible, and when the chip enable signal CE # is deactivated to a logic high level, it may denote that the corresponding memory chip is in a standby state.

The command latch enable signal CLE may be a signal for receiving the command CMD transmitted through the data lines DL, and activated to a logic high level while the command CMD is inputted to the memory device 400. The address latch enable signal ALE may be a signal for receiving the address ADD transmitted through the data lines DL, and activated to a logic high level while the address ADD is inputted to the memory device 400.

The write enable signal WE # may be toggled when the data DQ<7:0> including the command CMD and the address ADD are loaded to the memory device 400, and the read enable signal RE # may be toggled when the data DQ<7:0> including the data DQ are loaded to the memory controller 30. When the write enable signal WE # transitions from a logic low level to a logic high level, that is, at a rising edge of the write enable signal WE #, the command CMD and the address ADD may be input to the memory device 400. Depending on an embodiment, when the write enable signal WE # transitions from a logic high level to a logic low level, that is, at a falling edge of the write enable signal WE #, the command CMD and the address ADD may be input to the memory device 400.

The memory device 400 may receive the data DQ<7:0> or output the data DQ<7:0> to the memory controller 300 through the data lines DL. When the data DQ<7:0> are composed of 8 bits, the data lines DL may be provided with 8 lines. However, the number of data lines DL is not limited to eight, and may be expanded to 16 or 32 in various embodiments.

In a write operation, the memory device 400 may receive the data DQ<7:0> in synchronization with the data strobe signal DQS. For example, in a double data rate (DDR) mode, the memory device 400 may receive the data DQ<7:0> at every rising edge and falling edge of the data strobe signal DQS. In a read operation, the memory device 400 may output the data DQ<7:0> in synchronization with the data strobe signal DQS. Accordingly, the memory device 400 may be a synchronous memory device that operates in synchronization with the data strobe signal DQS.

According to an embodiment of the present invention, the memory controller 300 may include a defect analysis circuit 310 for collecting defect analysis information in a process stage and selecting a plurality of fail points of the memory device 400 based on the collected defect analysis information. The memory controller 300 may provide the memory device 400 with an address ADD designating one of the fail points along with a command CMD (hereinafter, a partial reset command P_RST) indicating a partial reset operation.

Figure 5:
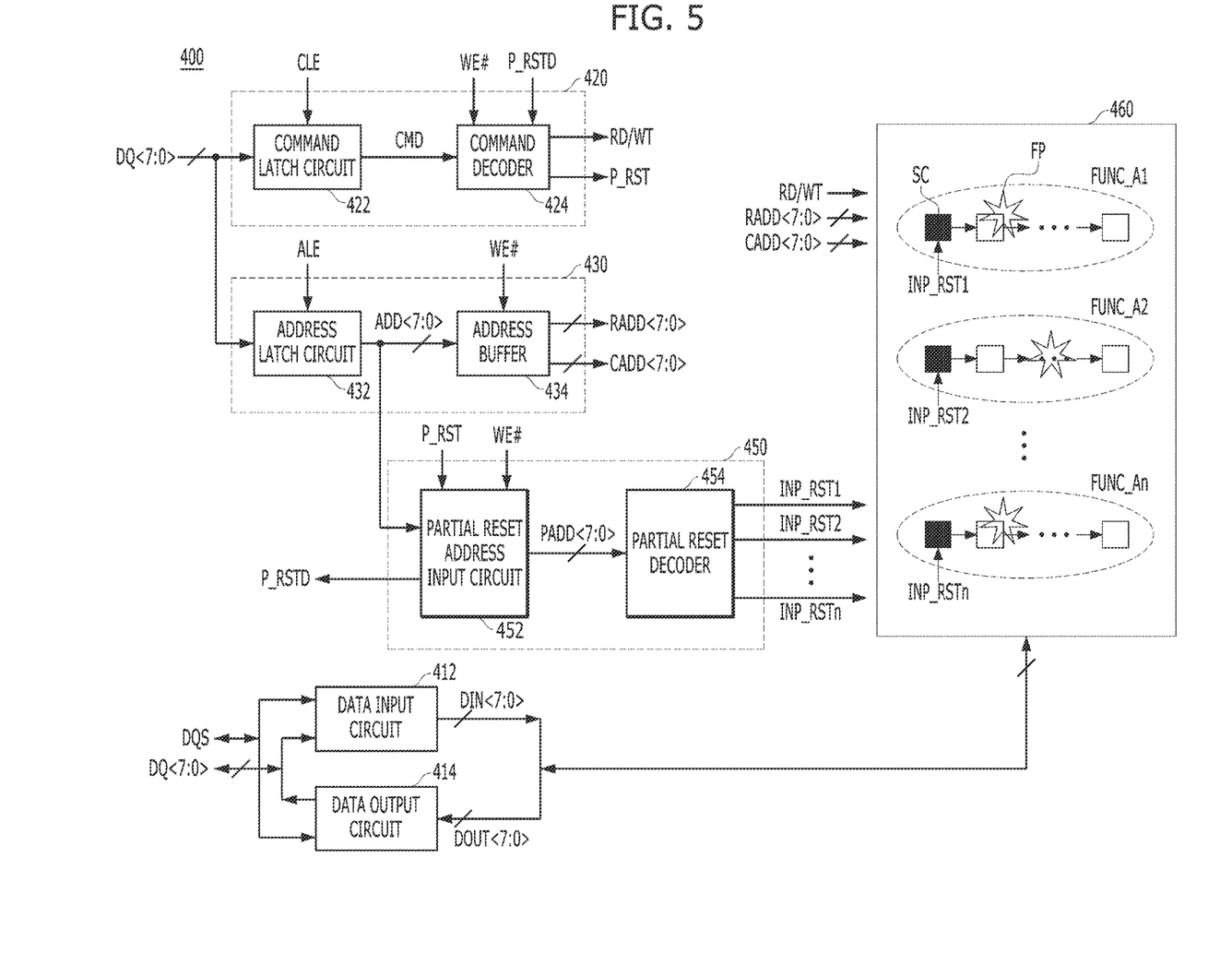
FIG. 5 is a detailed block diagram illustrating a memory device of FIG. 4 in accordance with an embodiment of the present invention.

FIG. 5 is a detailed block diagram illustrating the memory device 400 of FIG. 4 in accordance with an embodiment of the present invention.

Referring to FIG. 5, the memory device 400 may include a data input circuit 412, a data output circuit 414, a command input circuit 420, an address input circuit 430, a reset control circuit 450, and an internal circuit 460.

The data input circuit 412 may receive the data DQ<7:0> as input data DIN<7:0> according to the data strobe signal DQS. The data output circuit 412 may output output data DOUT<7:0> read from the internal circuit 460 together with the data strobe signal DQS. Although not shown, the data output circuit 412 may generate a data strobe signal DQS according to a clock signal.

The command input circuit 420 may receive and decode data DQ<7:0> as a command CMD according to the command latch enable signal CLE and the write enable signal WE # to generate a read/write command RD/WT and a partial reset command P_RST. The read/write command RD/WT is a command for an internal operation such as a read operation or a write operation and may be defined as a normal operation command. The command input circuit 420 may include a command latch circuit 422 and a command decoder 424. When the command latch enable signal CLE becomes a logic high level, The command latch circuit 422 may receive the data DQ<7:0> as the command CMD. The command decoder 424 may decode the command CMD according to a rising edge of the write enable signal WE # to generate the read/write command RD/WT and the partial reset command P_RST. According to an embodiment of the present invention, the command decoder 424 may deactivate the partial reset command P_RST according to a reset initialization signal P_RSTD.

The address input circuit 430 may receive the data DQ<7:0>) as an address ADD<7:0> according to the address latch enable signal ALE and the write enable signal WE # to generate a row address RADD<7:0> and a column address CADD<7:0>. The address input circuit 430 may include an address latch circuit 432 and an address buffer 434. When the address latch enable signal ALE becomes a logic high level, the address latch circuit 432 may receive the data DQ<7:0> as the address ADD<7:0>. The address buffer 434 may buffer the address ADD<7:0> according to a rising edge of the write enable signal WE # to output the row address RADD<7:0> and the column address CADD<7:0>.

The reset control circuit 450 may receive and decode the address ADD<7:0> as a partial reset address PADD<7:0> according to the partial reset command P_RST and the write enable signal WE # to generate a plurality of partial reset signals INP_RST1 to INP_RSTn while activating at least one of the partial reset signals INP_RST1 to INP_RSTn. The reset control circuit 450 may activate the reset initialization signal P_RSTD for a preset time after a predetermined delay from an input of the partial reset address PADD<7:0>.

In detail, the reset control circuit 450 may include a partial reset address input circuit 452 and a partial reset decoder 454.

The partial reset address input circuit 452 may receive the address ADD<7:0> as the partial reset address PADD<7:0> according to the write enable signal WE # when the partial reset command P_RST is inputted. The partial reset address input circuit 452 may activate the reset initialization signal P_RSTD after a predetermined delay from the input of the partial reset address PADD<7:0> and initialize the partial reset address PADD<7:0> according to the reset initialization signal P_RSTD. A detailed configuration of the partial reset address input circuit 452 will be described with reference to FIG. 6.

The partial reset decoder 454 may decode the partial reset address PADD<7:0> to generate the partial reset signals INP_RST1 to INP_RSTn, while activating at least one among the partial reset signals INP_RST1 to INP_RSTn.

The internal circuit 460 may include a memory cell array and may perform internal operations such as a write (or program) operation and a read operation according to a normal operation command in an internal area of the memory cell array designated by the row address RADD<7:0> and the column address CADD<7:0>. According to an embodiment, the internal circuit 460 may be divided into a plurality of functional regions FUNC_A1 to FUNC_An including one or more fail points FP, respectively. The functional regions FUNC_A1 to FUNC_An may be classified according to a function of performing an operation for a predetermined purpose.

For example, the functional regions FUNC_A1 to FUNC_An may include a repair circuit, an error correction circuit, a termination circuit, an output driver, an input buffer, or functional blocks for performing functions of smaller units, as described in FIG. 1. Each functional region may include one or more logical circuits coupled in series or in parallel, decoding circuits, multiplexers, amplifiers/comparators, and/or sequential circuits, which are sequentially coupled in series or in parallel to perform assigned functions. Preferably, among the sequential circuits disposed in each functional region, a sequential circuit SC disposed at a frontmost end may be reset according to a corresponding partial reset signal. A detailed configuration of the internal circuit 460 will be described with reference to FIGS. 7 to 8C.

Figure 6:
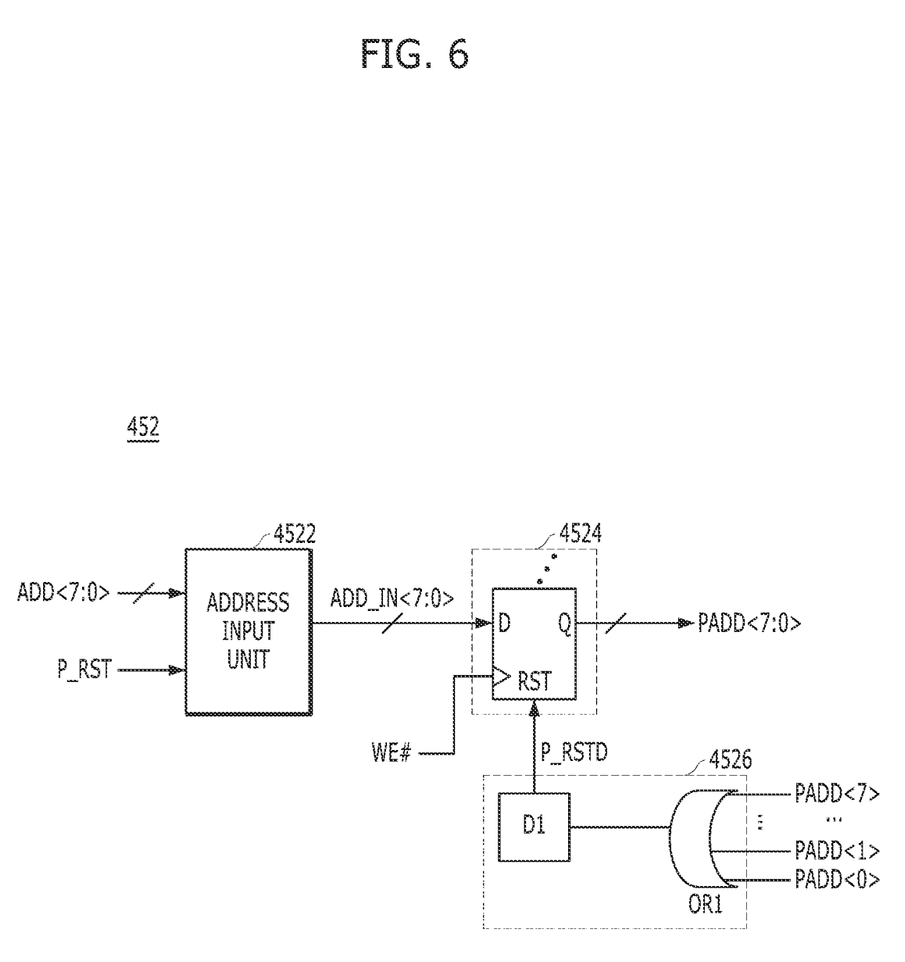
FIG. 6 is a configuration diagram conceptually illustrating a partial reset address input circuit of FIG. 5 in accordance with an embodiment of the present invention.

FIG. 6 is a configuration diagram conceptually illustrating the partial reset address input circuit 452 of FIG. 5 in accordance with an embodiment of the present invention.

Referring to FIG. 6, the partial reset address input circuit 452 includes an address input unit 4522, an address synchronization unit 4524, and an address initialization unit 4526.

The address input unit 4522 may receive the address ADD<7:0> as an internal address ADD_IN<7:0> when the partial reset command P_RST is inputted. For example, the address input unit 4522 may be implemented with a plurality of AND gates for performing a logic AND operation on the partial reset command P_RST and respective bits of the internal address ADD_IN<7:0>.

The address synchronization unit 4524 may latch the internal address ADD_IN<7:0> as the partial reset address PADD<7:0> in synchronization with the write enable signal WE #, and initialize the latched partial reset address PADD<7:0> in response to the reset initialization signal P_RSTD. The address synchronization unit 4524 may be implemented with a plurality of flip-flops corresponding to the respective bits of the internal address ADD_IN<7:0>. The flip-flops may receive the write enable signal WE # as a clock signal, the reset initialization signal P_RSTD as a reset signal (RST), the internal address ADD_IN<7:0> as an input terminal (D), and output the partial reset address PADD<7:0> as an output terminal (Q).

The address initialization unit 4526 may activate the reset initialization signal P_RSTD for a preset time after the partial reset address PADD<7:0> is outputted. The address initialization unit 4526 may include an OR gate OR1 for performing a logic OR operation on respective bits of the partial reset address PADD<7:0> and a delay D1 for delaying an output of the OR gate OR1 by a first delay time. The delay D1 may have a first delay time corresponding to a summation of an operation time of the partial reset decoder 454 and an operation time of the sequential circuit SC disposed in each functional region. That is, the address initializer 4526 may control to initialize the partial reset command P_RST and the partial reset address PADD<7:0>, after the sequential circuit SC disposed in each functional region is reset.

In the above embodiment, when the address initialization unit 4526 may be implemented with the OR gate OR1, the partial reset decoder 454 may decode the partial reset addresses PADD<7:0> from "00000001" to "111111111111" to generate the first to 255th partial reset signals INP_RST1 to 255. However, the present invention is not limited thereto, and the address initialization unit 4526 may be implemented with various logic gates to decode the 8-bit partial reset address PADD<7:0> to generate the first to 256th partial reset signals INP_RST1 to INP_RST256.

Figure 7:
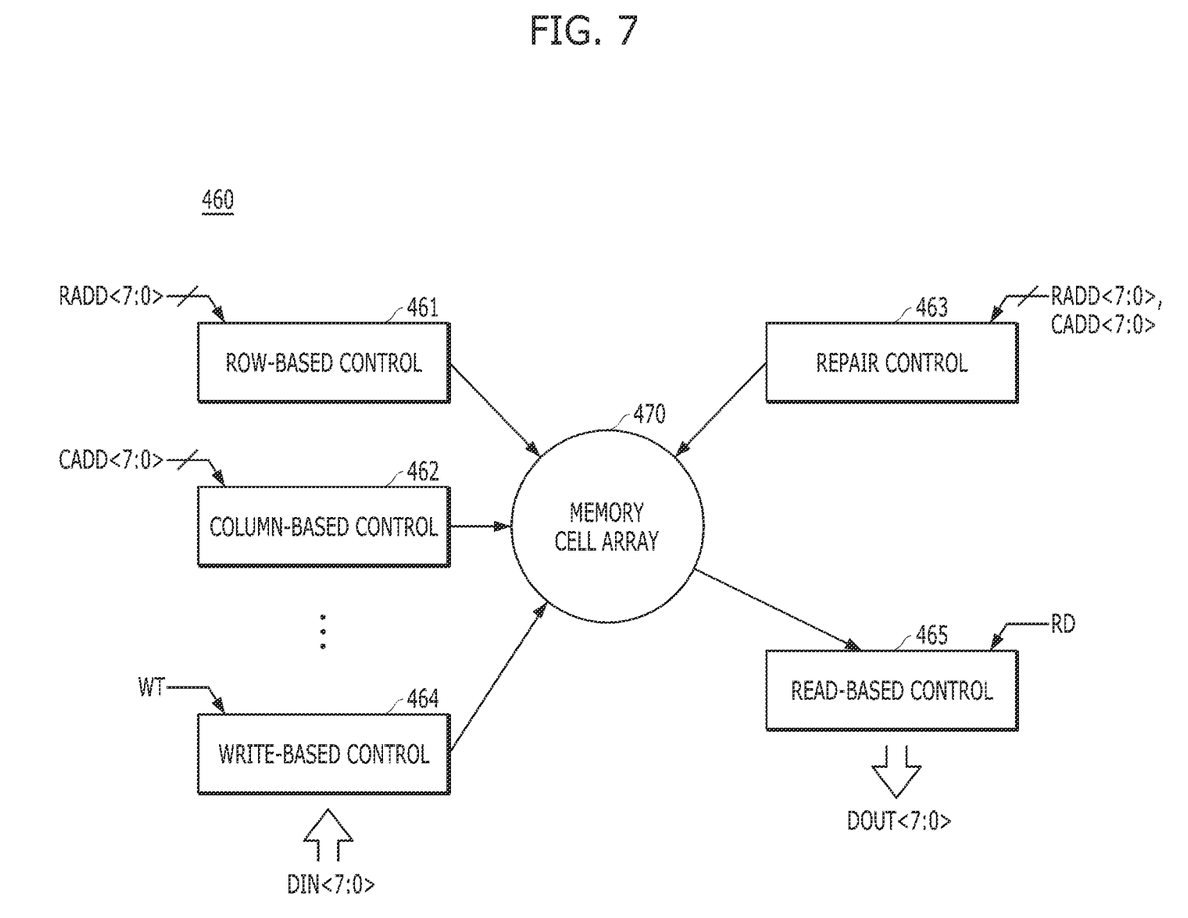
FIG. 7 is a detailed configuration diagram illustrating an internal circuit of FIG. 5 in accordance with an embodiment of the present invention.
Figure 8A:
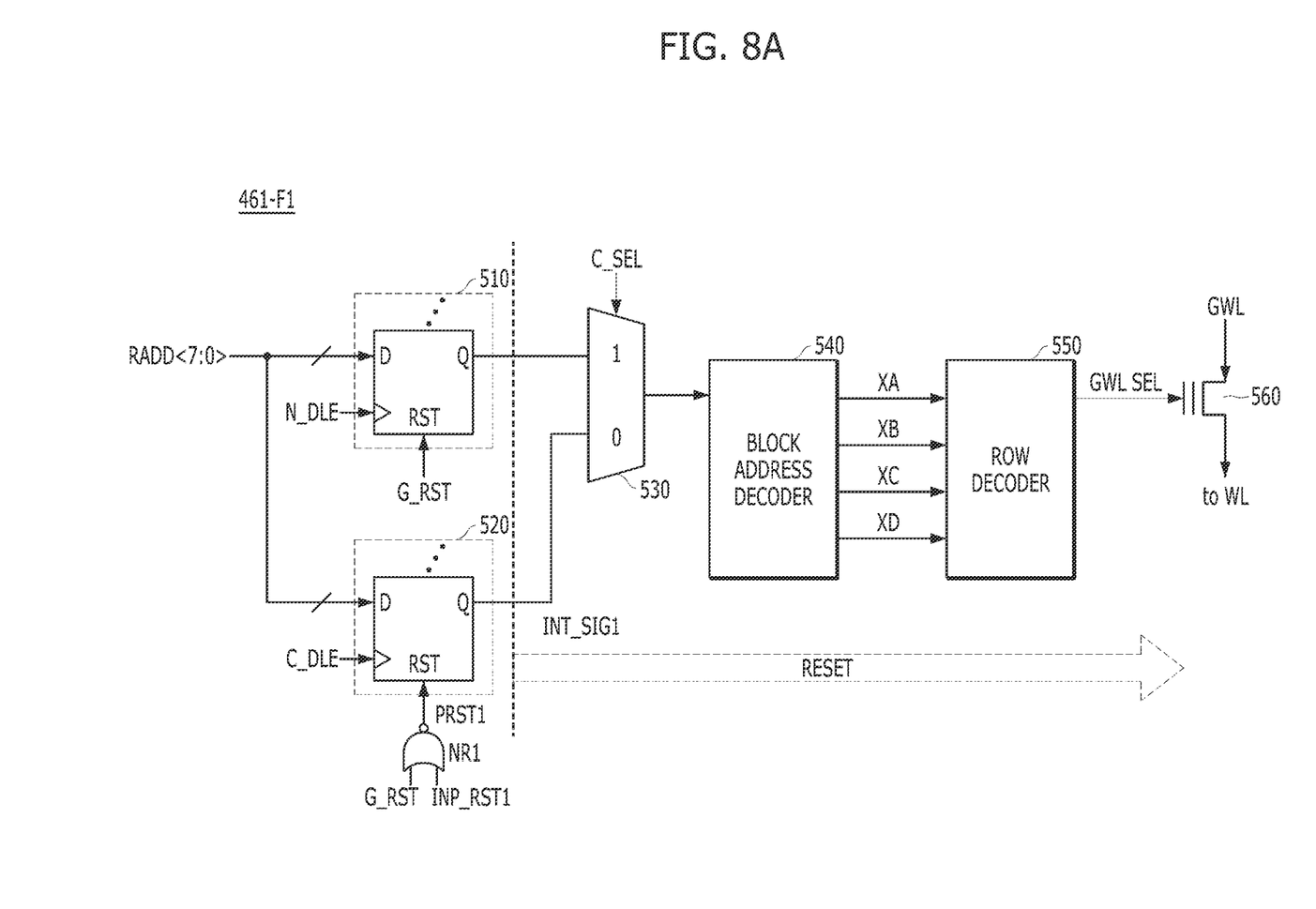
FIGS. 8A to 8C are circuit diagrams for describing functional regions of FIG. 7 in more detail in accordance with an embodiment of the present invention.
Figure 8B:
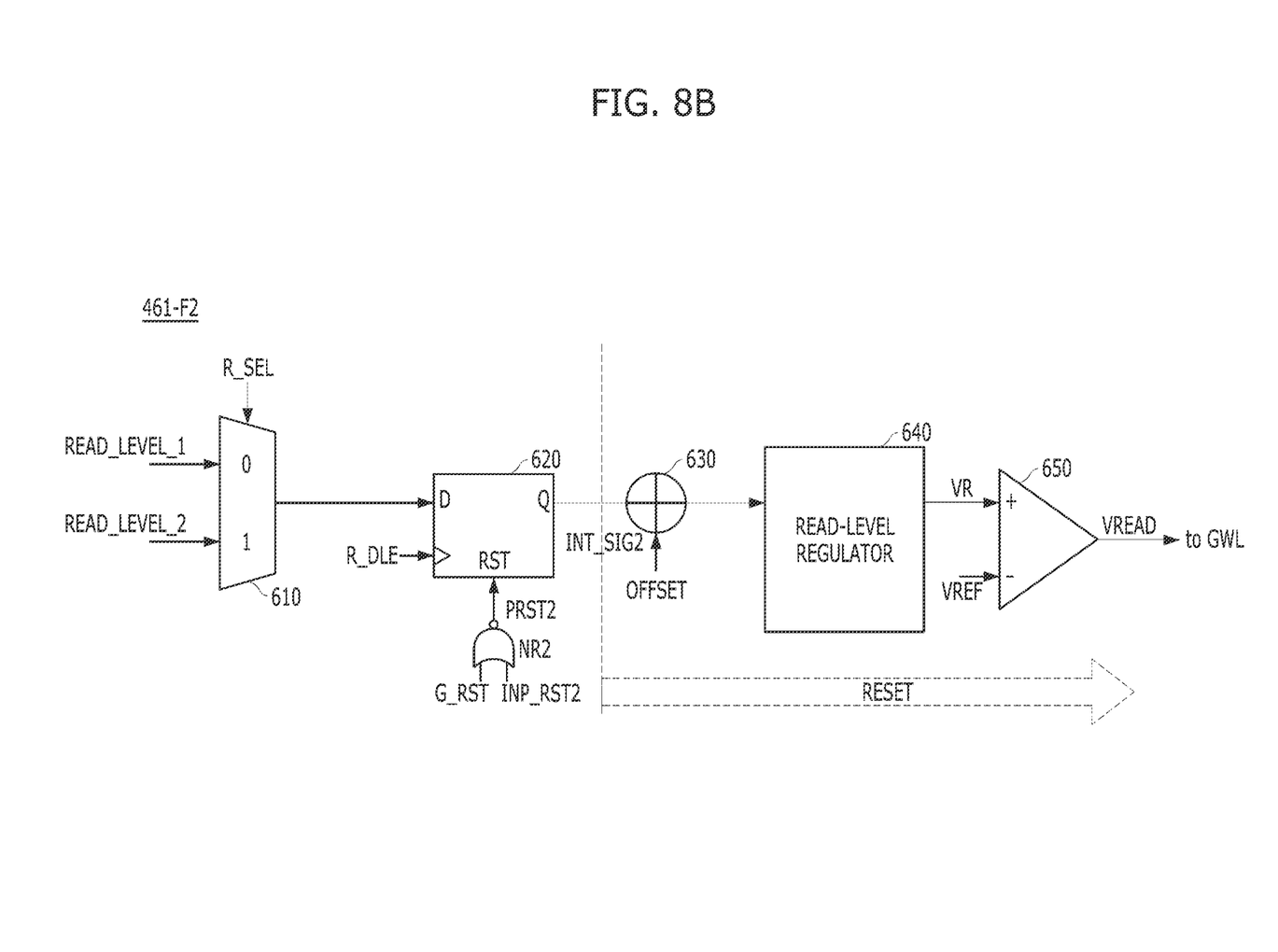
Figure 8C:
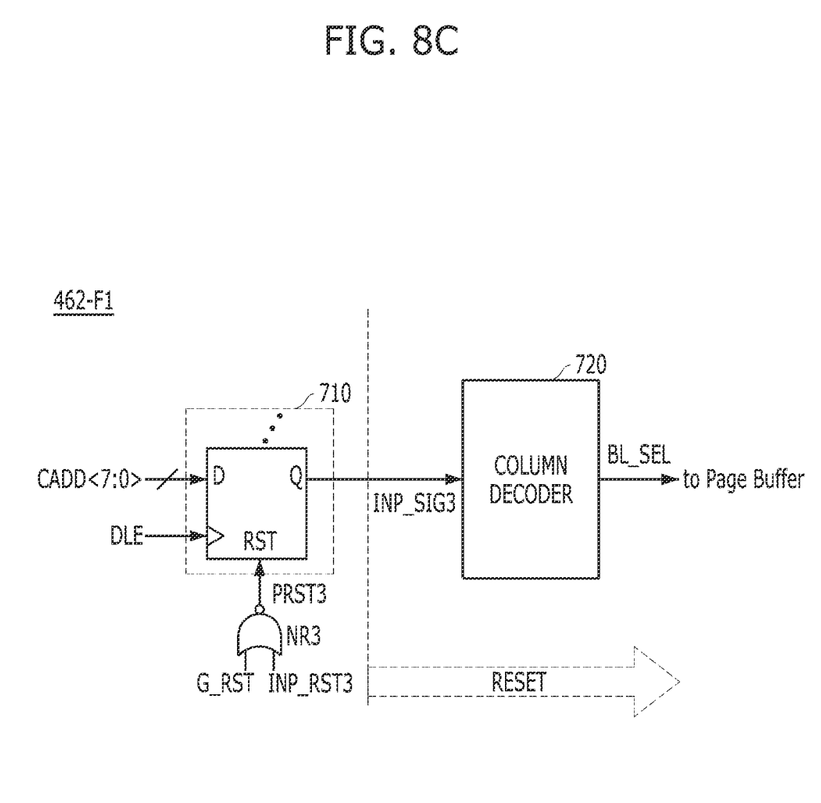

FIG. 7 is a detailed configuration diagram illustrating the internal circuit 460 of FIG. 5 in accordance with an embodiment of the present invention. FIGS. 8A to 8C are circuit diagrams for describing function regions 461 and 462 in more detail in accordance with an embodiment of the present invention.

Referring to FIG. 7, in case of the memory device 400, the internal circuit 460 may include a plurality of control circuits 461 to 465 that perform functions allocated for an operation of the memory cell array 470, and each of the control circuits 461 to 465 may include one or more functional regions. For example, the control circuits 461 to 465 may be divided into a row-based control circuit 461, a column-based control circuit 462, a repair control circuit 463, a write-based control circuit 464, and a read-based control circuit 465. However, the present invention is not limited thereto, and the control circuits may be configured in various ways depending on the function required T) for the operation of the memory device.

For reference, the memory cell array 470 may be coupled to the row-based control circuit 461 through a plurality of row lines (e.g., source selection lines, drain selection lines, word lines, global word lines, etc.), and may be coupled to the column-based control circuit 462 through a plurality of column lines (e.g., bit lines). The row-based control circuit 461 may control the row lines, and the column-based control circuit 462 may control the column lines.

In detail, referring to FIG. 8A, the row-based control circuit 461 may include a functional region 461-F1 for controlling a connection between a global word line GWL and a word line WL. For example, the functional region 461-F1 may include a first latch circuit 510, a NAND gate ND1, a second latch circuit 520, a selection circuit 530, a block address decoder 540, and a row decoder 550.

The first latch circuit 510 may latch the row address RADD<7:0> according to a normal data latch enable signal N_DLE and initialize a latched address according to a global reset signal G_RST of a logic high level. The NOR gate NR1 may generate an initialization signal PRST1 by performing a logic NOR operation on the global reset signal G_RST and the first partial reset signal INP_RST1. Since the global reset signal G_RST and the first partial reset signal INP_RST1 are signals activated to a logic high level, the NOR gate NR1 may activate the initialization signal PRST1 to a logic low level when one of the global reset signal G_RST and the first partial reset signal INP_RST1 is activated. The second latch circuit 520 may latch the row address RADD<7:0> according to a cache data latch enable signal C_DLE and initialize a latched address according to the initialization signal PRST1 of a logic low level. Each of the first latch circuit 510 and the second latch circuit 520 may include a plurality of flip-flops corresponding to respective bits of the row address RADD<7:0>.

The selection circuit 530 may select an output of the first latch circuit 510 or an output of the second latch circuit 520 according to a cache selection signal C_SEL. The block address decoder 540 may decode an output of the selection circuit 530 to generate a plurality of block address signals XA to XD. The row decoder 550 may decode the block address signals XA to XD and finally generate a word line selection signal GWL_SEL. The word line selection signal GWL_SEL may be provided as a gate of a transistor 560 coupled between the global word line GWL and the word line WL to control the connection between the global word line GWL and the word line WL.

With the above configuration, an operation of the functional region 461-F1 will be described as follows.

During a normal operation, the functional region 461-F1 may latch and decode the row address RADD<7:0> to generate the word line selection signal GWL_SEL according to when the normal data latch enable signal N_DLE is activated during a normal program operation, or according to when the cache data latch enable signal C_DLE is activated during a cache program operation. In the normal operation, the functional region 461-F1 may be initialized according to the global reset signal G_RST. On the other hand, during a partial reset operation, the second latch circuit 520 may be initialized according to the first partial reset signal INP_RST1 to initialize an output signal INT_SIG1 to a logic low level. Accordingly, the output signal INT_SIG1 of a logic low level may be provided to the selection circuit 530, the block address decoder 540, and the row decoder 550, and thus the functional region 461-F1 may be initialized.

Referring to FIG. 8B, the row-based control circuit 461 may include a functional region 461-F2 for applying a read voltage VREAD to a global word line GWL (or a word line WL). For example, the functional region 461-F2 may include a selection circuit 610, a NOR gate NR2, a latch circuit 620, an offset reflection circuit 630, a read-level regulator 640, and a voltage driver 650.

The selection circuit 610 may select a first read-level signal READ_LEVEL_1 or a second read-level signal READ_LEVEL_2 according to a read-level selection signal R_SEL. The NOR gate NR2 may generate an initialization signal PRST2 by performing a logic NOR operation on the global reset signal G_RST and the second partial reset signal INP_RST2. The latch circuit 620 may latch an output of the selection circuit 610 according to a read latch enable signal R_DLE and initialize a latched read-level according to the initialization signal PRST2 of a logic low level. The latch circuit 620 may be configured as a flip-flop. The offset reflection circuit 630 may reflect a preset offset value OFFSET on an output signal INT_SIG2 of the latch circuit 620. The read-level regulator 640 may generate a read-level voltage VR corresponding to an output of the offset reflection circuit 630, and the voltage driver 650 may compare a reference voltage VREF with the read-level voltage VR to finally output the read voltage VREAD. The read voltage VREAD may be applied to the global word line GWL to perform a read operation.

With the above configuration, an operation of the functional region 461-F2 will be described as follows.

During a normal operation, the functional region 461-F2 may generate the read-level voltage VR by reflecting the preset offset value OFFSET on the read-level signal selected according to the read-level selection signal R_SEL when the read latch enable signal R_DLE is activated, and output the read voltage VREAD based on the read-level voltage VR. In the normal operation, the functional region 461-F2 may be initialized according to the global reset signal G_RST. On the other hand, during a partial reset operation, the latch circuit 620 may be initialized according to the second partial reset signal INP_RST2 to initialize the output signal INT_SIG2 to a logic low level. Accordingly, the output signal INT_SIG2 of a logic low level may be provided to the offset reflection circuit 630, the read-level regulator 640, and thus the functional region 461-F2 may be initialized.

Referring to FIG. 8C, the column-based control circuit 462 may include a functional region 462_F1 for applying a bit line selection signal BL_SEL for selecting one of a plurality of bit lines, to a plurality of page buffers. For example, the functional region 462-F1 may include a NOR gate NR3, a latch circuit 710, and a column decoder 720.

The NOR gate NR3 may generate an initialization signal PRST3 by performing a logic NOR operation on the global reset signal G_RST and the third partial reset signal INP_RST3. The latch circuit 710 may latch the column address CADD<7:0> according to a latch enable signal DLE and initialize a latched address according to the initialization signal PRST3 of a logic low level. The latch circuit 710 may include a plurality of flip-flops corresponding to respective bits of the column address CADD<7:0>. The column decoder 720 may decode an output signal INT_SIG3 of the latch circuit 710 to generate the bit line selection signal BL_SEL for selecting one of the bit lines.

With the above configuration, an operation of the functional region 462-F1 will be described as follows.

During a normal operation, the functional region 461-F1 may latch and decode the column address CADD<7:0> according to when the latch enable signal DLE is activated, and generate the bit line selection signal BL_SEL. In the normal operation, the functional region 461-F1 may be initialized according to the global reset signal G_RST. On the other hand, during a partial reset operation, the latch circuit 710 may be initialized according to the third partial reset signal INP_RST3 to initialize the output signal INT_SIG3 to a logic low level. Accordingly, the output signal INT_SIG3 of a logic low level may be provided to the column decoder 720, and thus the functional region 462-F1 may be initialized.

Hereinafter, a partial reset operation of the memory system 20 according to an embodiment of the present invention will be described with reference to FIGS. 4 to 9.

Figure 9:
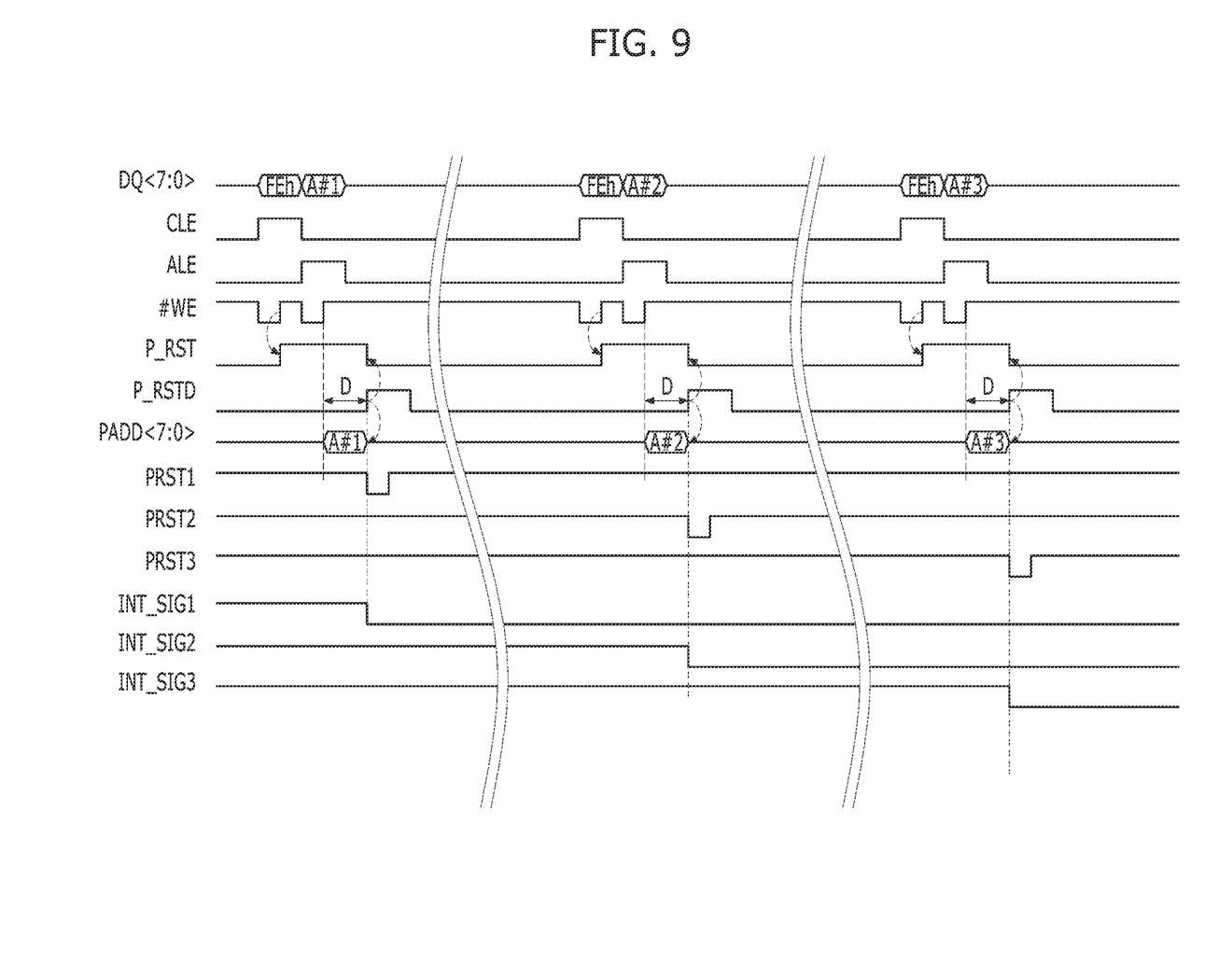
FIG. 9 is a timing diagram for describing a partial reset operation of a memory system in accordance with an embodiment of the present invention.

FIG. 9 is a timing diagram for describing a partial reset operation of the memory system 20 in accordance with an embodiment of the present invention.

Referring to FIG. 9, the memory controller 300 may provide data DQ<7:0> including a command CMD of "FEh" indicating a partial reset operation together with a command latch enable signal CLE to the memory device 400. When the command latch enable signal CLE becomes a logic high level, the command input circuit 420 may receive and decode the data DQ<7:0> as the command CMD according to a rising edge of a write enable signal WE # to activate a partial reset command P_RST.

Thereafter, the memory controller 300 may provide the data DQ<7:0> including an address ADD "A #1" designating one of the fail points FP together an address latch enable signal ALE to the memory device 400. The address latch circuit 432 may receive the data DQ<7:0> as the address ADD<7:0> when the address latch enable signal ALE becomes a logic high level. The reset control circuit 450 may receive and decode the address ADD<7:0> as a partial reset address PADD<7:0> according to the partial reset command P_RST and the write enable signal WE # to activate a first partial reset signal INP_RST1 corresponding to the address ADD "A #1", among a plurality of partial reset signals INP_RST1 to INP_RSTn.

In detail, when the partial reset command P_RST is inputted, the partial reset address input circuit 452 may receive the address ADD<7:0> as the partial reset address PADD<7:0> according to the write enable signal WE #. The partial reset decoder 454 may decode the partial reset address PADD<7:0> to activate the first partial reset signal INP_RST1. For example, as described in FIG. 8A, since the initialization signal PRST1 may be activated to a logic low level according to the first partial reset signal INP_RST1, the second latch circuit 520 of the functional region 461-F1 may be initialized to initialize the output signal INT_SIG1 to a logic low level. Accordingly, the memory device 400 may reset only the functional region 461-F1 designated by the address ADD "A #1" according to the partial reset command P_RST.

Afterwards, the partial reset address input circuit 452 may activate the reset initialization signal P_RSTD for a preset time after the partial reset address PADD<7:0> is inputted. Accordingly, the partial reset command P_RST and the partial reset address PADD<7:0> may be initialized.

After the partial reset operation for the functional region 461-F1, the memory controller 300 provides the data DQ<7:0> including a command CMD and an address ADD instructing a test operation to the memory device 400, thereby performing the test operation. When the test result indicates fail, the memory controller 300 may provide the data DQ<7:0> including a command CMD of "FEh" and an address ADD "A #2" designating one of the fail points FP to the memory device 400.

The reset control circuit 450 may receive and decode the address ADD<7:0> as the partial reset address PADD<7:0> according to the partial reset command P_RST and the write enable signal WE # to activate a second partial reset signal INP_RST2 corresponding to the address ADD "A #2" among the partial reset signals INP_RST1 to INP_RSTn. For example, as described in FIG. 8B, since the initialization signal PRST2 may be activated to a logic low level according to the second partial reset signal INP_RST2, the latch circuit 620 of the functional region 461-F2 may be initialized to initialize the output signal INT_SIG2 to a logic low level. Accordingly, the memory device 400 may reset only the functional region 461-F2 designated by the address ADD "A #2" according to the partial reset command P_RST.

After the partial reset operation for the functional region 461-F2, the memory controller 300 provides the data DQ<7:0> including a command CMD and an address ADD instructing a test operation to the memory device 400, thereby performing the test operation. When the test result indicates fail, the memory controller 300 may provide the data DQ<7:0> including a command CMD of "FEh" and an address ADD "A #3" designating one of the fail points FP to the memory device 400.

Likewise, the reset control circuit 450 may receive and decode the address ADD<7:0> as the partial reset address PADD<7:0> according to the partial reset command P_RST and the write enable signal WE # to activate a third partial reset signal INP_RST3 corresponding to the address ADD "A #3" among the partial reset signals INP_RST1 to INP_RSTn. For example, as described in FIG. 8C, since the initialization signal PRST3 may be activated to a logic low level according to the third partial reset signal INP_RST3, the latch circuit 710 of the functional region 462-F1 may be initialized to initialize the output signal INT_SIG3 to a logic low level. Accordingly, the memory device 400 may reset only the functional region 462-F1 designated by the address ADD "A #3" according to the partial reset command P_RST.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of this disclosure and the following claims.

For example, for the logic gates and transistors provided as examples in the above-described embodiments, different positions and types may be implemented depending on the polarity of the input signal.

What is claimed is:

1. A semiconductor system comprising:
  a controller configured to:
    select a plurality of fail points based on defect analysis information collected in a process stage, and
    provide an address designating at least one of the fail points together with a partial reset command; and
  a semiconductor device including a plurality of functional regions each including one or more of the fail points, the semiconductor device configured to reset, in response to the partial reset command, a sequential circuit disposed in a target functional region corresponding to the address among the functional regions.

2. The semiconductor system of claim 1, wherein the controller is further configured to:
  provide a command for the semiconductor device to perform a test operation on the functional regions after resetting the sequential circuit disposed in the target functional region, and
  update the defect analysis information based on a result of the test operation.

3. The semiconductor system of claim 2, wherein the controller includes a defect analysis circuit configured to:
  select the fail points based on the defect analysis information collected in the process stage, and
  update the defect analysis information based on the result.

4. The semiconductor system of claim 3, wherein the defect analysis circuit is configured to update the defect analysis information to indicate the target functional region is defective when the test operation is determined to be successful.

5. The semiconductor system of claim 1, wherein the functional regions are classified according to a function of performing an operation for a predetermined purpose.

6. The semiconductor system of claim 1, wherein the semiconductor device includes:
  a reset control circuit configured to generate, in response to the partial reset command, a plurality of partial reset signals among which a partial reset signal corresponding to the address is activated; and
  an internal circuit including the functional regions having respective sequential circuits, the internal circuit being configured to reset at least one of the sequential circuits in response to a corresponding partial reset signal activated among the partial reset signals.

7. The semiconductor system of claim 6, wherein each of the sequential circuits includes a flip-flop that receives the corresponding partial reset signal as a reset signal thereof.

8. An operation method of a semiconductor system, comprising:
  selecting, by a controller, a plurality of fail points based on defect analysis information collected in a process stage;
  providing, by the controller, an address designating at least one of the fail points together with a partial reset command; and
  resetting, in response to the partial reset command and by a semiconductor device including a plurality of functional regions, each including one or more of the fail points, a sequential circuit disposed in a target functional region corresponding to the address among the functional regions.

9. The operation method of claim 8, further comprising:
  performing, by the semiconductor device, a test operation on the functional regions after resetting the sequential circuit disposed in the target functional region; and
  updating, by the controller, the defect analysis information based on a result of the test operation.

10. The operation method of claim 9, wherein the updating the defect analysis information includes updating the defect analysis information to indicate the target functional region is defective when the test operation is determined to be successful.

11. The operation method of claim 8, wherein the functional regions are classified according to a function of performing an operation for a predetermined purpose.

12. The operation method of claim 8, wherein the resetting the sequential circuit disposed in the target functional region includes:
   generating, in response to the partial reset command, a plurality of partial reset signals among which a partial reset signal corresponding to the address is activated; and
   resetting the sequential circuit disposed in the target functional region in response to the activated partial reset signal.

13. The operation method of claim 12, wherein the sequential circuit disposed in the target functional region includes a flip-flop that receives the activated partial reset signal as a reset signal thereof.

14. A semiconductor device comprising:
   a command input circuit configured to generate a partial reset command by decoding an external command;
   a reset control circuit configured to decode a partial reset address in response to the partial reset command and configured to generate a plurality of partial reset signals among which a partial reset signal corresponding to the partial reset address is activated; and
   an internal circuit including a plurality of functional regions having respective sequential circuits, one or more of which have one or more fail points, the internal circuit being configured to reset the sequential circuit disposed in a target functional region corresponding to the activated partial reset signal among the functional regions.

15. The semiconductor device of claim 14,
further comprising:
   the command input circuit configured to generate a normal operation command by decoding the external command; and
   an address input circuit configured to generate an internal address by buffering an address,
   wherein the internal circuit is further configured to perform an internal operation according to the normal operation command using the sequential circuits.

16. The semiconductor device of claim 14, wherein the sequential circuit disposed in the target functional region includes a flip-flop that receives the activated partial reset signal as a reset signal thereof.

17. The semiconductor device of claim 14, wherein the reset control circuit includes:
   a partial reset address input circuit configured to:
      receive an address as the partial reset address according to the partial reset command,
      activate a reset initialization signal after a first delay time from the receiving of the partial reset address, and
      initialize the partial reset address according to the reset initialization signal; and
   a partial reset decoder configured to decode the partial reset address to generate the partial reset signals while activating the partial reset signal corresponding to the partial reset address.

18. The semiconductor device of claim 17, wherein the first delay time corresponds to a sum of operation time amounts of the partial reset decoder and the sequential circuit.

19. The semiconductor device of claim 17, wherein the command input circuit is further configured to initialize the partial reset command according to the reset initialization signal.

20. The semiconductor device of claim 17, wherein the partial reset address input circuit includes:
   an address input unit configured to receive the address as an internal address when the partial reset command is inputted;
   an address synchronization unit configured to latch the internal address as the partial reset address in synchronization with a write enable signal, and initialize the latched partial reset address in response to the reset initialization signal; and
   an address initialization unit configured to activate the reset initialization signal for a preset time after the first delay time from the receiving of the partial reset address.

* * * * *